United States Patent [19]

Van Zantel

[11] Patent Number: 4,728,824
[45] Date of Patent: Mar. 1, 1988

[54] CONTROL CIRCUIT OF A PLURALITY OF STL TYPE LOGIC CELLS IN PARALLEL

[75] Inventor: François Van Zantel, Meylan, France

[73] Assignee: Thomson-CSF, Paris, France

[21] Appl. No.: 922,515

[22] Filed: Oct. 23, 1986

[30] Foreign Application Priority Data

Oct. 29, 1985 [FR] France ................. 85 16048

[51] Int. Cl.[4] .................. H03K 19/013; H03K 19/084; H03K 19/092; H03K 17/04
[52] U.S. Cl. ..................................... 307/457; 307/458; 307/459; 307/477; 307/559; 307/296 R
[58] Field of Search .................. 307/456–460, 307/475, 477, 563, 547, 549, 553, 558, 559, 296 R; 357/15, 92

[56] References Cited

U.S. PATENT DOCUMENTS

| 3,999,080 | 12/1976 | Weathersby, Jr. et al. | 307/456 |
| 4,037,115 | 7/1977 | Lee | 307/456 |
| 4,330,723 | 5/1982 | Griffith | 307/458 X |
| 4,595,942 | 6/1986 | Lohstroh | 307/458 X |

FOREIGN PATENT DOCUMENTS 1572797 8/1980 United Kingdom ............. 307/458

OTHER PUBLICATIONS

M. Cukier et al., "General Purpose Driver Circuit", IBM Technical Disclosures, Bulletin, vol. 23, No. 7B, Dec. 1980, p. 3263.
J. Chen et al., "Schottky Transistor Logic Macro Receive Cell", IBM Tech. Disclosure Bulletin, vol. 20, No. 2, Jul. '77, pp. 608–610.
Patents Abstracts of Japan, vol. 7, No. 243; Oct. 28, 1983.

Primary Examiner—Stanley D. Miller
Assistant Examiner—David R. Bertelson
Attorney, Agent, or Firm—Roland Plottel

[57] ABSTRACT

The invention provides for switching a large number of STL cells in parallel through the action on their power terminal rather than on their control terminal, the control circuit comprising at least one input STL cell, a first input Schottky transistor, a second Schottky transistor the base of which is connected to the emitter of the first Schottky transistor, the emitter of which is connected to the earth and the collector of which is connected to an output terminal; and two transistors connected to from a Darlington circuit between a first power source and the said output terminal, the base of the first of the two transistors being connected to the collector of the first Schottky transistor, to the first power source through a biasing resistance to a second standardized power voltage of a STL cell through two diodes.

6 Claims, 4 Drawing Figures

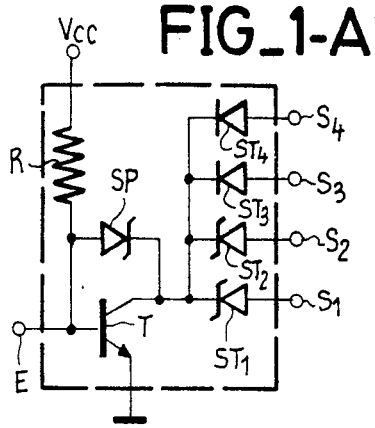
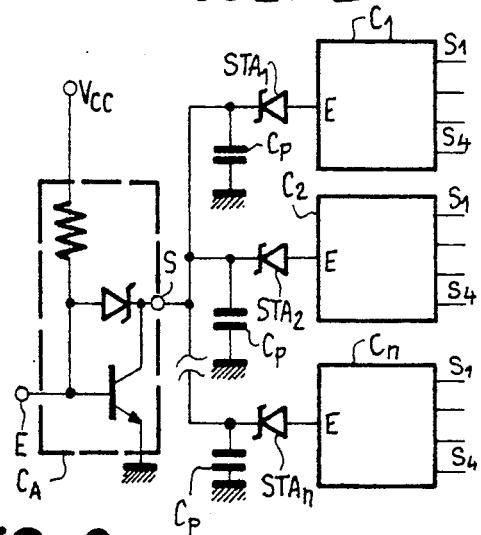
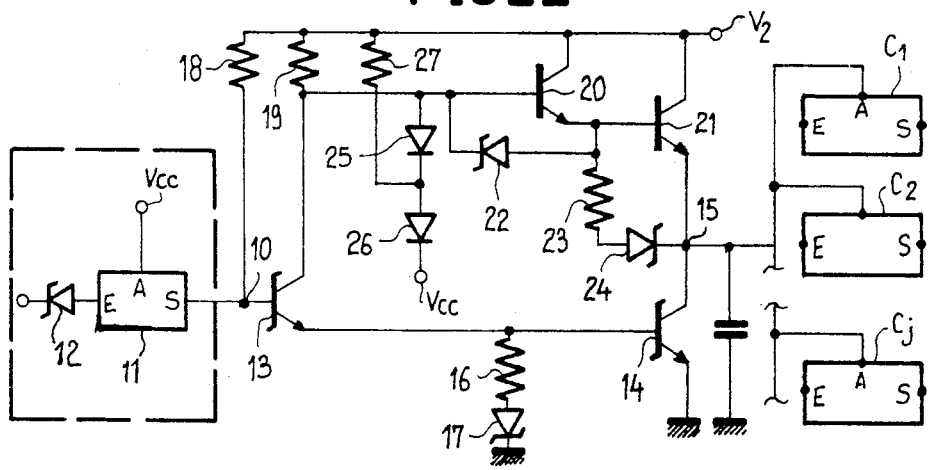
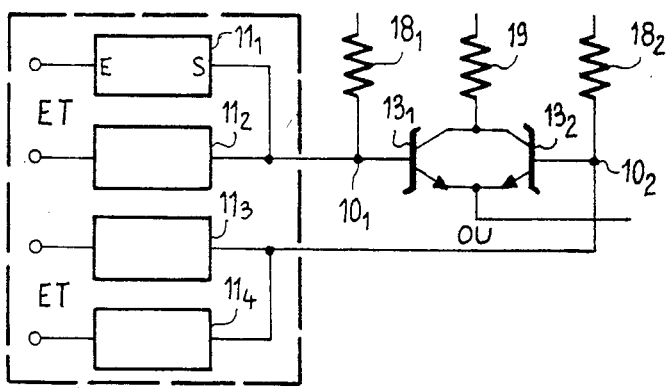

CONTROL CIRCUIT OF A PLURALITY OF STL TYPE LOGIC CELLS IN PARALLEL

BACKGROUND OF THE INVENTION

Field of the Invention

The present invention relates to a control circuit of a plurality of Schottky Transistor Logic (STL) type logic cells in parallel.

A STL type logic cell is shown in FIG. 1. It comprises a NPN transistor T, a Schottky diode of a first type SP connected in parallel with the base-collector junction of the transistor, conductive from the base towards the collector, Schottky diodes of a second type ST1 to ST4 conductive between the output terminals S1 to S4 and the collector of transistor T, and a resistance R connecting the base of the transistor T, which is also connected to an input terminal E, at a supply voltage VCC. The emitter of the transistor T is connected to the ground.

This kind of cell can occupy a very small surface area on an integrated circuit since the all of the components T, SP and ST1 to ST4 can be integrated inside a single well without intervening insulating walls. The SP and ST Schottky diodes are such that the direct voltage drop (VSP) in the diode SP is greater than the direct voltage drop (VST) in a ST diode. The SP diode is, for example, an N type platinum silicide/silicon Schottky diode of which the direct voltage drop is about 620 mV at 25° C. and the ST diodes are N type titanium/silicon Schottky diodes in which the direct voltage drop is about 420 mV at 25° C., i.e. VSP−VST=200 mV. In theory, this difference in voltage slightly varies with the temperature.

This logic cell constitutes an inverter able to assume either of two states: low input/high outputs or high input/low outputs.

In order to examine the threshold voltage of this kind of cell, it will be presumed that the input is connected to an output of a preceding cell and that the outputs are connected to the inputs of following cells. In the high state of a cell (low input/high outputs), the transistor of this cell is blocked while the transistors of the preceding and following cells are conductive. The output terminals of the cell are thus at a voltage VS(1) that corresponds to the base-emitter voltage of a conductive transistor, in other terms VS(1)=VBE. The input terminal is at a voltage VE(0)=VBE−VSP+VST, or in the numerical example indicated above VBE−0.2 V. In the low state (the transistor of the cell involved being conductive) the input and output voltages are inverted, i.e. VE(1)=VBE and VS(0)=VBE−VSP+VST.

It will be noted that the difference of potential between the high and the low states is relatively small in this type of logic circuit, typically about 0.2 V.

The output capacity of a STL cell will now be considered, i.e. the number of output terminals that can be associated with this kind of cell (4 in the example of FIG. 1A), while maintaining satisfactory operation. At the low state of the output, the transistor T is conductive and the current in this transistor depends upon the number n of output terminals associated with the cell. In fact, it should be recalled that each output terminal is connected to a supply voltage source VCC through the intermediary of a resistor R of the following cell. If the number of output terminals is equal to n, the current flowing through the transistor is substantially equal to (n/1) (VCC−VBE)/R. It is known that when the collector-emitter current in a transistor increases, this results in an increase of the base-emitter voltage drop VBE of this transistor. Therefore, the high and low levels of the transistor move closer together since, as previously seen, for the high state VS(1)=VBE1 and for the low state VS(0)=VBE2−VSP+VST with VBE2 greater that VBE1. Furthermore, an increase of the base-emitter voltage corresponds to an increase in the base current and consequently a reduction of current in the Schottky diode SP. As a result the drop in voltage in this Schottky diode decreases, thereby further contributing to the increase in threshold voltage at the low state VS(0) which moves close to VS(1). Consequently, the high and low states of the logic circuit become difficult to differentiate. Practical calculations show that in fact the output capacity of a STL cell is limited to a value of about 4, i.e. it is not possible to connect more than four Schottky diodes ST in parallel at the output.

Consequently, if it is desired to control n cells where n is greater than four with a single signal, due to the output capacity being limited to 4 per cell unit, it is necessary to provide a control cell CA, equivalent to n/4 elementary cells in parallel. In practice, this is performed by multiplying by the factor n/4 the surface of the transistor T and of the diode SP, and by dividing by the same factor the value of the resistor R. In order to avoid n connections towards the n controlled cells Cl to Cn, the n output diodes STA1 to STAn of the cell CA are moved to locations close to the input terminal of the controlled cells. Thus, a single connection distributes the control signal. This is the solution proposed by the prior art represented in FIG. 1B.

An alternative solution consisting of connecting, on the control connection, the n inputs of the controlled cells is not applicable for various reasons. In particular, all the base-emitter junctions of the cells to be controlled are in parallel and, if a small shift or difference exists between the base-emitter voltages of these cells due, for example, to a lack of similarity in the transistors of the integrated circuits, to an impedance difference of the emitter-ground connection, or to a different value of the current, this will result in certain cells no longer ensuring the logic zero at their output. These various reasons are summarily designated in the literature under the name of "Hogging effect".

The drawbacks of the prior art set out above are the following:

to ensure the logic zero, the control cell must absorb the n currents of the cells controlled through a relatively long connection (n=about 200 to 1,000), this connection must also be very large in order to limit the voltage drop that is to be deducted from the logic jump (which is already small per se) of the STL logic, thereby causing a loss of space and a high stray capacity.

the displaced diodes ST must have their individual insulating wells, which also involves a loss of space and a very high stray capacitance (n times the well/substrate capacitance) on the control line.

The total stray capacitance (metallization and diodes) on the line can only be compensated (in the worst case where n−1 inputs are at logic zero) by the single elementary current of the cell unit of which the input is a logic 1, which results in a considerable delay in the transistion 0/1.

in the worst case where n−1 inputs are at state 0, the inverse leak current of the displaced n−1 diodes is deducted from the useful current of the single input at the state 1. The diodes ST having a low threshold, the inverse currents are particularly strong at 150° C.

the input current of the control cell being one quarter of the output current, which is n times the elementary current, it is necessary to provide several control cells in cascade, before assuring the control by a single elementary cell, which results in a loss of space, an increase in consumption and an increase in propagation time.

The drawbacks mentioned herein-above render very difficult, or even impossible the direct control in parallel of a large number of STL gates (200 to 1,000) by this method. In certain logic structures, for example of the pipe line type, that are increasingly utilized, the parallelism of the calculation involves the parallelism of the sequency controls thereby requiring control of a great number of logic gates by a single signal (for example by a register clock-signal).

One object of the present invention is to achieve this result in a simple manner, while utilizing an integrated circuit having a small surface area.

With this purpose in view, the present invention provides a control circuit of a great number of STL logic cells in parallel. These cells each comprise a transistor, a first Schottky diode connected between the base and the collector of this transistor, a plurality of second Schottky diodes connected to the collector of this transistor, an input terminal connected to the base of the transistor, output terminals connected to the second Schottky diodes, a power supply terminal connected to the base of the transistor through a resistor and a ground terminal connected to the emitter of the transistor. In this circuit, the power supply terminals of the cells in parallel are connected to the power supply source through switching means controlled by the logic signal that is to be applied to the said cells, the input terminals of the said cells being connected to the output terminals of other STL cells.

In one embodiment of the present invention, the switching means, in a first state, supply the standard supply voltage required for the STL cells and, in a second state, supply a voltage close to the level of the ground.

In another embodiment of the invention, the switching means are connected to the standard power supply source and comprise a second higher voltage source and means to supply, in the first state, exactly the voltage of the standardized voltage source through compensation of the voltage drops of the transistors of the circuit.

In one embodiment of the present invention, the commutation means comprise:
at least one input Schottky diode;
a first input Schottky transistor;
a second Schottky transistor the base of which is connected to the emitter of the first Schottky transistor, the emitter of which is connected to the ground while its collector is connected to an output terminal, and
two transistors forming a Darlington circuit between the second power source and the said output terminal, the base of the first of these transistors being connected:
to the collector of the first Schottky transistor,
to the second power source through a biasing resistor; and
to the first power source supplying the standardized power voltage, through two diodes.

BRIEF DESCRIPTION OF THE DRAWINGS

These aims, advantages and objects of the invention among others will be described in further detail in the following description of particular embodiments given with reference to the appended figures in which:

FIG. 1A schematically represents a conventional cell of the STL type;

FIG. 1B shows a classical arrangement of a plurality of STL cells connected in parallel;

FIG. 2 represents a control circuit of a large number of STL type cells in parallel according to the present invention;

FIG. 3 represents an alternative of the input circuit of the control circuit according to the present invention.

DETAILED DESCRIPTION OF THE PREFERRED EMBODIMENTS

FIG. 2 shows a large number of STL cells in parallel $C_1, C_2 \ldots C_j \ldots$ that are simply represented in the form of block units with an input terminal E, a power supply terminal A and an output terminal S, it being well understood that each of the cells normally comprises up to four output terminals. The output terminals are connected to other cells of a chain that are themselves individually powered. The input terminals E are connected to the output terminals of other STL cells.

The basic idea of the present invention is to ensure the switching over of the cells in parallel $C_1, C_2 \ldots C_j$ ... by switching their power voltage rather than acting on the input terminals E. It will be noted that this idea which is set forth in the present description as a result of logical conclusions breaks with current practice in the logic circuit control field. In fact, while the cells C of FIG. 2 have been represented by showing their terminals E, A and S, the designer of logic circuits only usually considers the input/output terminals and does not represent in its logic diagrams the power terminals nor the ground terminals, these power and earth terminals being classically considered unavoidable constitutive elements connected to determined, constant potentials.

According to the present invention, the power terminals A of the cells in parallel are connected to a single power supply circuit that supplies at the high level the power voltage VCC applied to all the other STL cells of the logic network that comprises the cells connected in parallel. With this aim, the control circuit is connected to two power sources, a first power source VCC for supplying power to all the STL cells of the network, this power voltage having generally a value of about 2 V, and a second power voltage V2 at a higher potential than that of the power source VCC, for example 5 V. It will be noted that such a power voltage V2 is already available in a conventional STL structure where it acts to feed the input/output interfaces.

The control circuit represented in FIG. 2 comprises an input 10 that is connected to the output of one or several STL cells 11 the input terminal E of which receives, through a ST type Schottky diode 12, a control signal, for example, in typical applications, a pulse-shaped signal. The power terminal A of the cell 11 receives the VCC voltage (or voltage V1) and the output terminal is connected to a Schottky transistor 13, i.e. a transistor constituted by the association in parallel of a classical bipolar transistor and a SP diode, like the transistor of a STL cell. The emitter of this transistor 13 is connected to the base of a Schottky transistor 14, the emitter of which is connected to the ground and the collector of which is connected to the common control terminal 15 of all the power terminals of the cells C1, C2 ... Cj.... The base of the transistor 14 is furthermore connected to the ground through a circuit comprising in serie a resistor 16 and a Schottky diode 17. The base of the transistor 13 is connected to the terminal of power voltage V2 through a biasing resistor 18 and its collector to this terminal through a resistor 19. The collector of the transistor 13 is also connected to the base of a NPN type transistor 20 mounted in a Darlington configuration with a NPN type transistor 21, i.e. the collectors of the transistors 20 and 21 are interconnected and connected to the terminal of the power voltage source V2 while the emitter of the transistor 20 is connected to the base of the transistor 21. The emitter of the transistor 21 is connected to the terminal 15 common to the supply sources of the cells controlled in parallel. The emitter and the base of the transistor 20 are decoupled by a Schottky diode 22 and the connection in series of a resistor 23 and of a Schottky diode 24 between the base and the emitter of the transistor 21 prevents saturation of this transistor. Furthermore, the base of the transistor 20 is connected to the power voltage V1 by two diodes 25 and 26 connected in series; these diodes being constituted by base-emitter junctions of NPN bipolar transistors, the bases and the collector of which are short-circuited. The median point of the two diodes 25 and 26 is connected to the power voltage source V2 through a resistor 27.

In a first state, the transistor 14 is conductive and the terminal 15 is at the potential of the ground plus a voltage of about 0.2 V. In second state, the transistors 20 and 21 are conductive. In order to determine the potential on the terminal 15, it is assumed that this potential is equal to the potential on the base of the transistor 20 reduced by the base-emitter voltage drops in the transistors 20 and 21 ($V_{BE20}+V_{BE21}$). The potential on the base of the transistor 20 is itself equal to the potential V1 (or VCC) plus the potential drop in the diodes 25 and 26 ($V_{BE25}+V_{BE26}$). Therefore, the terminal 15 is at the potential $V1+V_{BE26}+V_{BE25}-V_{BE20}-V_{BE21}$, i.e., since, in a first approximation the various VBE are substantially equal, at to the potential V1, which is the potential VCC applied to all the power terminals of the cells of the network that comprises the cells in parallel C1, C2 ... Cj....

The invention overcomes the present drawbacks inherent in the devices according to the prior art. In fact, it is possible to provide from a single terminal 15 of the control circuit a connection with all the power terminals of the cells to be controlled in parallel. It will be noted that as a result of the logic zero being established by the absence on power of the controlled gates, there is no current flow through the control line, thus also solving the problem of voltage drops. Furthermore, at the logic level 1, even if a drop of voltage occurs in the conductor connecting the terminals 15 to one of the most remote cells, that is of only minor importance since this voltage drop must be compared to the voltage VCC of about 2 V, while, in the circuits according to the prior art, differences of 200 mV were applied to the input terminals E and, if there was a voltage drop of e.g. 50 mV, in the conductors, that could be extremely important.

Furthermore, the control circuit according to the present invention allows substantially maintaining the speed performances of a STL circuit. In fact, upon switching, whatever the number of gates in parallel, the delay between the control and the output is about 2 nanoseconds for the circuit control; i.e. the delay corresponding to two STL cells in series, which is less than the delay inherent in a conventional cascade arrangement once the number of gates increases. In fact, in order to control $4^3=64$ gates it is generally necessary to provide three stages in series (propagation time of about 3 ns) and for $4^4=256$ gates four stages in series are required (propagation time about 4 ns).

Another advantage of the present invention is that, although a source V2 of about 5 V is provided in addition to the usual power source VCC of about 2 V, the power consumption does not significantly increase. Indeed, there is consumption of the 2 V supply during only the high states of the cells in parallel, i.e. during only half the time required for conventional applications of the clock type circuitries.

Yet another advantage of the present invention is that the control circuit can itself be controlled by STL logic cell chains in order to produce the input of the logic functions. Therefore, the input part of the circuit represented in FIG. 2 can be replaced by the circuit shown in FIG. 3 which successively performs the AND and OR functions after which the control circuit itself performs an inversion (a NO). The AND functions are performed by STL cell assemblies in parallel of which the outputs are interconnected, for example $11_1$ and $11_2$ for a first AND gate, $11_3$ and $11_4$ for a second AND gate. For the OR function, two transistors $13_1$ and $13_2$ similar to transistor 13 are utilized, the bases $10_1$ and $10_2$ of which are connected to the power voltage V2 through respective resistors $18_1$ and $18_2$ corresponding to the resistor 18. The collectors are connected to the power voltage V2 through a resistor 19 and the emitters are connected to the base of the transistor 14. The simplicity of producing such an OR function must be noted since it cannot be performed directly by the conventional STL logic circuit.

What is claimed is:

1. A control circuit including a plurality of logic STL cells that are in parallel, each cell comprising a transistor, a first Schottky diode connected between the base and collector of the transistor, at least one second Schottky diode connected to the collector of the transistor, an input terminal connected to the base of the transistor for receiving logic signals, a separate output to each of the second Schottky diodes, a power terminal connected to the base of the transistor through a resistor, and a ground terminal connected to the emitter of the transistor, and switching circuit means, each of the power terminals of the cells being connected to the power source by way of the switching circuit means for switching the voltage level at the power terminal between first and second states under control of the logic signals being applied to the input terminals of each cell.

2. A control circuit according to claim 1, wherein said switching circuit means, in a first state, supply standard level voltage required for the STL cells and, in a second state, supply a voltage level close to the level of the ground.

3. A control circuit according to claim 2, wherein said switching circuit means comprise a first voltage source supplying said standard voltage, and a second higher voltage source, and means for supplying, in the first state, a voltage equal to that of the standard voltage source with compensation for the voltage drops occurring in the transistors of the circuit.

4. A control circuit according to claim 1, wherein said switching circuit means are controlled by at least an STL type cell.

5. A control circuit according to claim 4, wherein said switching circuit means are controlled by an assembly of STL cells to form a logic network.

6. A control circuit according to claim 2, wherein said switching circuit means comprise:
- at least one input Schottky diode;
- a first input Schottky transistor;
- a second Schottky transistor the base of which is connected to the emitter of said first input Schottky transistor, and the emitter of which is connected to ground, while its collector is connected to an output terminal;
- two transistors interconnected to form a Darlington circuit between said second voltage source and said output terminal, the base of said Darlington circuit being connected:
  (a) to the collector of said first Schottky transistor,
  (b) to said second voltage source, through a biasing resistor, and
  (c) to said first voltage source supplying said standard supply voltage level, through two diodes.

* * * * *